(12) United States Patent
Zhang et al.

(10) Patent No.: US 12,412,834 B2
(45) Date of Patent: Sep. 9, 2025

(54) TRIPLE-SIDED MODULE

(71) Applicant: Avago Technologies International Sales Pte. Limited, Singapore (SG)

(72) Inventors: Dingyou Zhang, San Jose, CA (US); Christopher Paul Wade, Los Gatos, CA (US); Li Sun, San Jose, CA (US); Chris Chung, San Jose, CA (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 519 days.

(21) Appl. No.: 17/727,586

(22) Filed: Apr. 22, 2022

(65) Prior Publication Data

US 2023/0343704 A1    Oct. 26, 2023

(51) Int. Cl.
| | |
|---|---|
| *H01L 23/528* | (2006.01) |
| *H01L 21/48* | (2006.01) |
| *H01L 23/00* | (2006.01) |
| *H01L 23/31* | (2006.01) |
| *H01L 23/498* | (2006.01) |
| *H01L 25/18* | (2023.01) |

(52) U.S. Cl.
CPC ...... *H01L 23/5283* (2013.01); *H01L 21/4857* (2013.01); *H01L 23/3128* (2013.01); *H01L 23/49816* (2013.01); *H01L 24/11* (2013.01); *H01L 24/17* (2013.01); *H01L 24/27* (2013.01); *H01L 24/30* (2013.01); *H01L 25/18* (2013.01); *H01L 2224/17104* (2013.01); *H01L 2224/73204* (2013.01); *H01L 2224/92125* (2013.01); *H01L 2924/15311* (2013.01)

(58) Field of Classification Search
None
See application file for complete search history.

(56) References Cited

U.S. PATENT DOCUMENTS

| | | | |
|---|---|---|---|
| 9,947,625 B2* | 4/2018 | Lin | ......................... H01L 21/52 |
| 2016/0260689 A1* | 9/2016 | Meyer | ..................... H01L 25/50 |

OTHER PUBLICATIONS

Partial European Search Report, EP-23165321.3, dated Sep. 21, 2023, 14 pages.

* cited by examiner

*Primary Examiner* — Long Pham
(74) *Attorney, Agent, or Firm* — Quarles & Brady LLP (57) ABSTRACT

An apparatus includes a first substrate comprising one or more first interconnection layers, wherein a first die is coupled to a first side of the first substrate, and a second substrate comprising one or more second interconnection layers. The second die may be coupled to a first side of the second substrate, and a third die is coupled to a second side of the second substrate. The first substrate and the second substrate may be stacked together.

15 Claims, 8 Drawing Sheets

TRIPLE-SIDED MODULE

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for a semiconductor package including a substrate having interconnection layers.

BACKGROUND

Increasingly, complex systems being implemented in system-in-package modules containing one or more processor die, respective high-bandwidth memory (HBM) modules, and in some cases input/output (I/O) die driving co-packaged optics or co-packaged copper outputs. As systems continue to scale up, additional compute capability, memory capacity, and compute-to-memory bandwidth, and off-module I/O bandwidth similarly increase, outstripping the capabilities of conventional technology.

In conventional double-sided modules, the placement for flip-chip dies and passive components on the top side of the PCB has been the bottleneck for overall module size reduction in the x- and y-directions. The module height (z-direction) is further bottlenecked by component height on the top side, physical limitations of silicon dies on the bottom side, and minimum routing and ground layer counts in the PCB.

Thus, methods, systems, and apparatuses for a triple-sided module are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Various embodiments set forth a triple-sided semiconductor module, and methods of manufacturing triple-sided modules.

In some embodiments, a triple sided module apparatus is provided. The apparatus includes a first substrate comprising one or more first interconnection layers, wherein a first die is coupled to a first side of the first substrate, and a second substrate comprising one or more second interconnection layers. The second die may be coupled to a first side of the second substrate, and a third die is coupled to a second side of the second substrate. The first substrate and the second substrate may be stacked together.

In further embodiments, a triple-sided semiconductor device is provided. The semiconductor device includes a first semiconductor module and second semiconductor module. The first semiconductor module includes a first substrate comprising one or more first interconnection layers, and a first die coupled to a first side of the first substrate. The second semiconductor module may be coupled to the first semiconductor module, and further include a second substrate comprising one or more second interconnection layers, a second die coupled to a first side of the second substrate, and a third die coupled to a second side of the second substrate. The first semiconductor module and the second semiconductor module are stacked together In further embodiments, a method of manufacturing a triple-sided module is provided. The method includes forming a first substrate comprising one or more first interconnection layers, and mounting a first die to a first side of the first substrate. The method continues with forming a second substrate comprising one or more second interconnection layers, mounting a second die to a first side of the second substrate, and mounting a third die to a second side of the second substrate opposite the first side of the second substrate. The method further includes connecting the first substrate and the second substrate, wherein the first and second substrate are stacked together.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Similarly, when an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

In conventional semiconductor packages, the placement for flip-chip dies and passive components on the top side of the PCB has been a bottleneck for overall module size reduction. Specifically, module height is bottlenecked by physical limitations of components and PCB layers. The proposed triple-sided module may be a semiconductor module (e.g., integrated circuit (IC), chip, or other semiconductor device) that provides an additional substrate surface, enabling more flexible die placement and additional area for floorplan optimization, and, in turn, allowing smaller package sizes to be achieved while package height remains the same. Furthermore, in some examples of a triple-sided module, RDL layers may be used to replace some or all of the layers of the PCB for height reduction, and a combination of an exposed die+PCB cavity may be employed for further height reduction.

Figure 1:
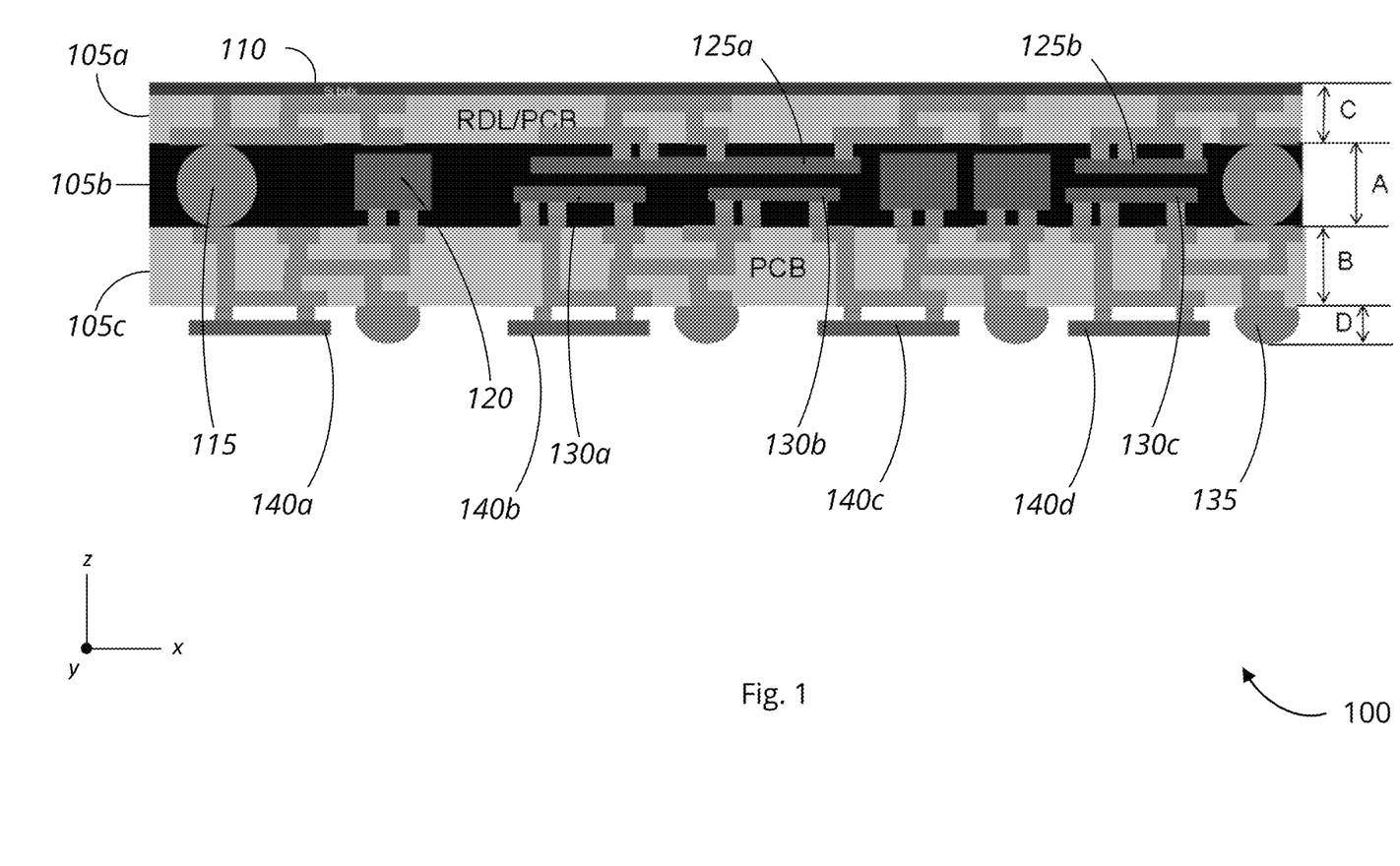
FIG. 1 is a schematic cross-sectional view of a triple-sided module, in accordance with various embodiments.

FIG. 1 is a schematic cross-sectional view of a triple-sided semiconductor module 100, in accordance with various embodiments. The semiconductor module 100 includes a first substrate layer 105a, gap 105b, second substrate layer 105c, silicon bulk 110, a first set of solder ball(s) 115, surface mount technology (SMT) component(s) 120, a first set of dies 125, which may include one or more first dies 125a-125b, second set of dies 130, which may include one or more second dies 130a-130c, a second set of solder ball(s) 135, and a third set of dies 140, which may include one or more third dies 140a-140d. It should be noted that the various components of the triple-sided semiconductor module 100 are schematically illustrated in FIG. 1, and that modifications to the various components and other arrangements of semiconductor module 100 may be possible and in accordance with the various embodiments.

In various embodiments, the triple-sided semiconductor module 100 includes two substrates, the first substrate 105a and second substrate 105c. The first and second substrate 105a, 105c may, provide three surfaces for die placement. For example, the first substrate 105a provides, on a first side a first surface for die placement, where the first side of the first substrate 105a faces the second substrate 105c. The second substrate 105c, in various examples, provides two surfaces for die placement. A first side of the second substrate 105c, facing the first substrate 105a, may be a second surface for die placement, and a second side of the second substrate 105c, opposite the first side of the second substrate 105c, may be a third surface for die placement.

In various examples, the first substrate 105a may include one or more respective routing layers used for component interconnects. In some examples, the first substrate 105a may be a RDL. Accordingly, in some examples, the first substrate 105a is produced using a wafer far back end of line (FBEoL) process, which allows for finer line width/spacing, and a much thinner layer thickness relative to a PCB production process. In other examples, the first substrate layer 105a is a PCB. Similarly, the second substrate 105c may include one or more respective routing layers. Thus, like the first substrate 105a, in some examples, the second substrate 105c may be a RDL or PCB.

In various examples, the first set of dies 125 may include semiconductor dies, such as flip chip dies. Thus, the first set of dies 125 may, in some examples, be surface mounted or wire bonded to the first substrate 105a. In some examples, the first set of dies 125 are surface mounted to a surface of a bottom layer (e.g., the first side) of the first substrate 105a. Alternatively, in some examples, a die of the first set of dies 125 may be mounted to an internal layer of the first substrate 105a, for example, within a substrate cavity. The first substrate 105a may, in some further examples, be coupled to a layer of silicon bulk 110. In some examples, the silicon bulk 110 includes, without limitation, one or more of a silicon carrier die, buffer die, or other silicon wafer substrate. The silicon bulk 110, in various examples, is configured to provide additional rigidity and/or mechanical strength to the first substrate 105a. The silicon bulk 110, in some examples, is configured for package marking. The second substrate 105c may be coupled to a second set of dies 130 and other SMT components 120. SMT components 120, for example, may include, without limitation, various types of passive elements, such as capacitors, inductors, resistors, and filters. The second set of dies 130 may include semiconductor dies coupled to the second substrate 105c. The second set of dies 130 may similarly be surface mounted or wire bonded to the second substrate 105c. In some examples, the second set of dies 130 may be surface mounted to a top layer (e.g., the first side) of the second substrate 105c, or alternatively, to an interior layer as previously described with respect to the first substrate 105a. Thus, the first substrate 105a and second substrate 105c may be arranged such that the bottom layer (e.g., first side) of the first substrate 105a and top layer (e.g., first side) of the second substrate 105c are facing each other.

In various examples, the first and second substrates 105a, 105c may be coupled to one another. In some examples, the first substrate 105a and second substrate 105c may be coupled via a first set of solder balls 115. In some examples, the first set of solder balls 115 includes one or more solder balls positioned in the gap 105b between the first substrate 105a and the second substrate 105c. In some alternative examples, instead of solder balls 115, copper (Cu) posts or Cu-cored solder balls may be used to couple the first substrate 105a to the second substrate 105c. Accordingly, in various examples, the first and second substrates 105a, 105c may be stacked together (e.g., on top of each other) in the z-direction (e.g., along an axis approximately orthogonal to a plane defined by the first substrate and/or second substrate).

In various examples, a gap 105b may be formed between the first and second substrates 105a, 105c. One or more SMT components 120, and the first set of dies 125, and a second set of dies 130 may be positioned within the gap 105b. In some examples, the first set of dies 125 may be arranged such that the one or more first dies 125a-125b overlaps the one or more second dies 130a-130c of the second set of dies 130 in the z-direction. For example, the one or more first dies 125a-125b may include a first die 125a and second die 125b. In the example shown, the first die 125a of the first set of dies 125 overlaps the first die 130a and second die 130b of the second set of dies 130. Similarly, the second die 125b of the first set of dies may overlap the second die 130c of the second set of dies 130. In various examples, the gap 105b may further be filled via suitable molding techniques, as known to those skilled in the art, using, for example, epoxy molding compounds (EMCs).

In further examples, a second side (or bottom layer) of the second substrate 105c may further include a third set of dies 140, in which one or more third dies 140a-140d may be coupled to the bottom layer of the second substrate. As with the second set of dies 130, the third set of dies 140 may be surface mounted to the bottom layer of the second substrate 105c. The bottom layer of the second substrate 105c may further include a second set of solder balls 135, which may allow the triple-sided semiconductor module 100 to further be coupled to other components and circuitry.

Thus, as surface mounted components, such as SMT components 120, first set of dies 125, second set of dies 130, and third set of dies 140 can be mounted on three different substrate surfaces, a reduction in overall module size may be realized. In further examples, the gap 105b may be configured such that SMT components 120 may further retain their original size and heights, improving radio frequency (RF) performance with higher Q factors. In some examples, the footprint of the triple-sided semiconductor module 100 in the x- and y-directions may be reduced while spacing among individual components, such as the SMT components 120, one or more first dies 125a-125b, one or more second dies 130a-130c, and one or more third dies 140a-140d retain their original distances. In this way, RF performance may be improved by mitigating crosstalk, while realizing a reduction in overall size relative to traditional arrangements. Moreover, because the one or more first dies 125a-125b, one or more second dies 130a-130c, and one or more third dies 140a-140d may retain their original size and thickness, mechanical strength and handling feasibility is retained, and size reductions in module height (e.g., in the z-direction) may be realized without further thinning of the dies, which can lead to minority carrier lifetime reduction due to silicon (Si) crystal lattice distortion and corresponding drifting of device performance. In yet further embodiments, additional ground (GND) layers may be employed as needed, in either the first or second substrate 105a, 150c to provide improved RF performance.

Thus, the triple-sided semiconductor module 100 allows for a total substrate thickness (e.g., the combined thickness of the first substrate 105a and second substrate 105c) that is reduced relative to traditional arrangements utilizing, for example, one multi-layer PCB substrate in a double sided module. For example, typical thickness of one PCB layer may be around 30 micrometers (μm), with typical PCBs having between 4 and 9 total layers. In contrast, the typical RDL layer thickness is around 7-15 μm. Overlapped die thickness (e.g., thickness of the first die 125a of the first set of die 125 overlapped with the first die 130a of the second set of die 130), in some examples, may be in the range of around 50-110 μm. The thickness of the gap 105b may be in the range of 50-130 μm, which may be filled, as previously described, with molding material (e.g., EMC). SMT component 120 height may be in the range of 200-350 μm, while the first set of solder balls 115 includes solder balls that have a diameter in the 200-300 μm range.

Different arrangements of substrates and connections between substrates in the triple-sided semiconductor module 100 are illustrated below with respect to FIGS. 2-7.

Figure 2:
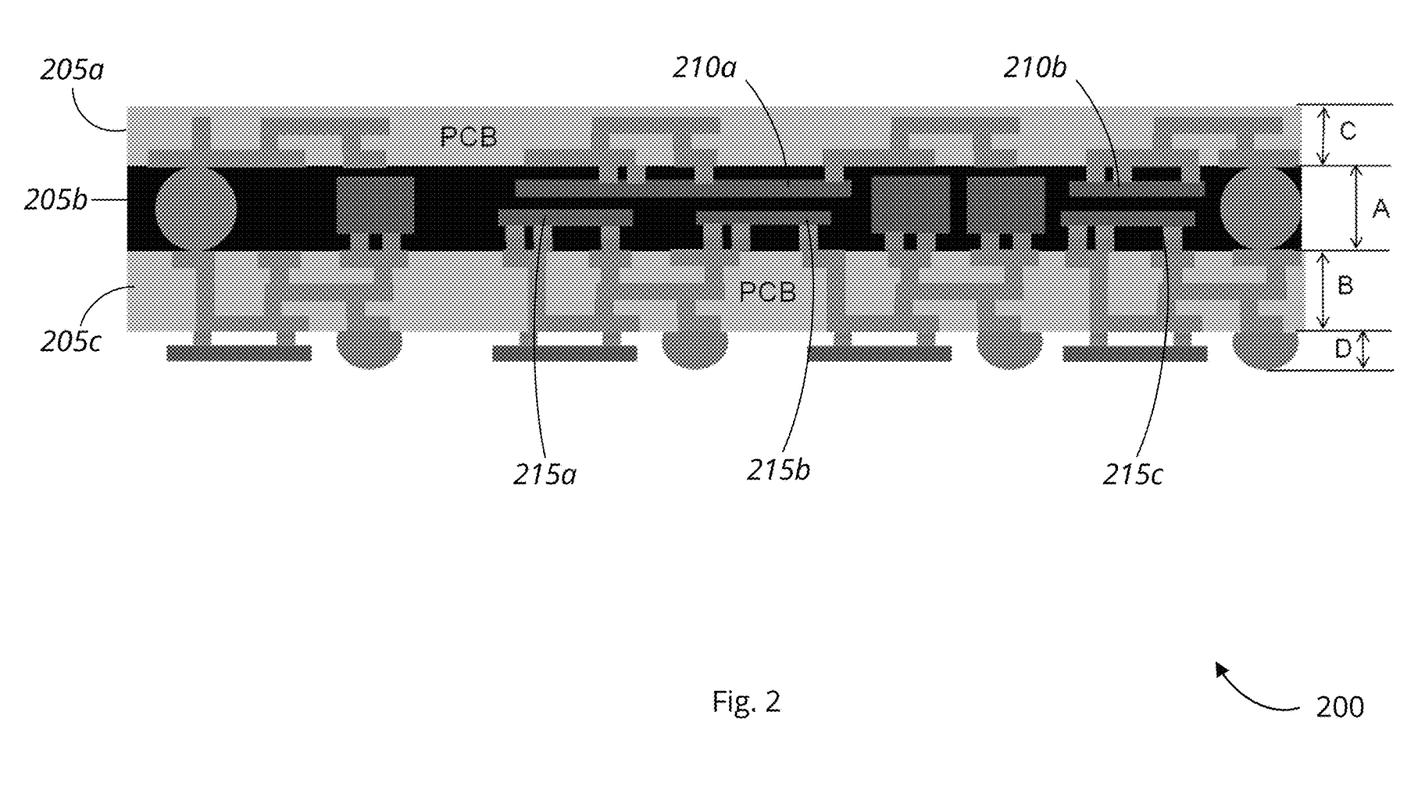
FIG. 2 is a schematic cross-sectional view of a triple-sided module having two printed circuit board (PCB) substrates, in accordance with various embodiments.

FIG. 2 is a schematic cross-sectional view of a triple-sided semiconductor module 200 having two printed circuit board (PCB) substrates, in accordance with various embodiments. The semiconductor module 200 includes a first substrate 205a, gap 205b, second substrate 205c, first set of dies 210 comprising one or more first dies 210a-210b, and a second set of dies 215 including one or more second dies 215a-215c. It should be noted that the various components of the triple-sided semiconductor module 200 are schematically illustrated in FIG. 2, and that modifications to the various components and other arrangements of semiconductor module 200 may be possible and in accordance with the various embodiments. In the embodiments depicted, both the first substrate 205a and second substrate 205c are PCBs. The first substrate 205a, in some examples, may be a PCB using prepreg and/or resin coated copper (RCC) material.

Figure 3:
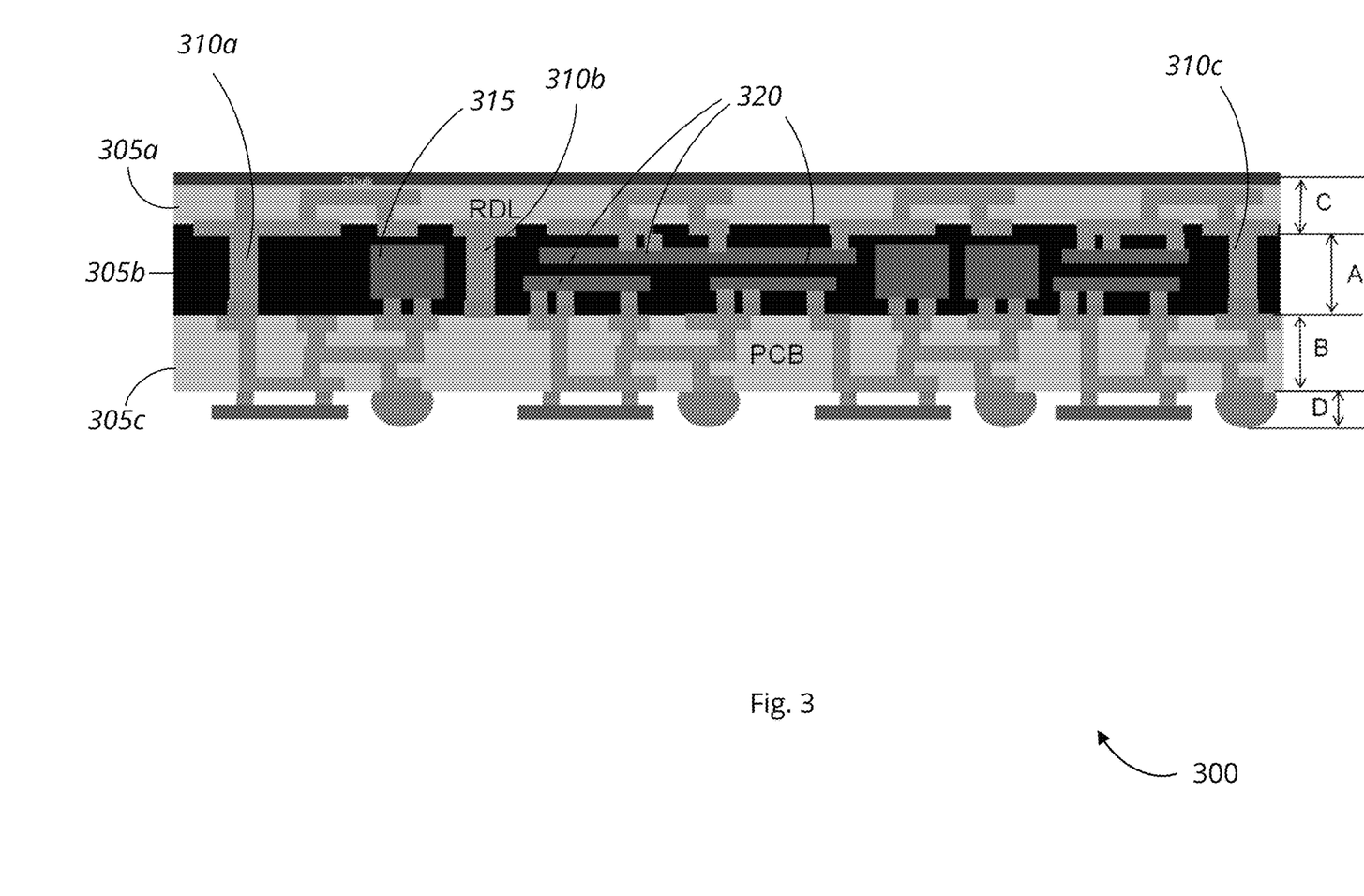
FIG. 3 is a schematic cross-sectional view of a triple-sided module with pillar-connected substrates, in accordance with various embodiments.

FIG. 3 is a schematic cross-sectional view of a triple-sided semiconductor module 300 with pillar-connected substrates, in accordance with various embodiments. The semiconductor module 300 includes a first substrate 305a, gap 305b, second substrate 305c, one or more pillars 310a-310c, SMT component 315, and one or more dies 320. It should be noted that the various components of the triple-sided semiconductor module 300 are schematically illustrated in FIG. 3, and that modifications to the various components and other arrangements of triple-sided semiconductor module 300 may be possible and in accordance with the various embodiments.

In the examples shown, the first substrate 305a may be coupled to the second substrate 305c via the one or more pillars 310. In various examples, the first substrate 305a may be a RDL and second substrate 305c a PCB. In some examples, the one or more pillars 310 may include copper pillars (e.g., a copper post), or other suitable copper structure. In some examples, the one or more pillars 310a-310c may be coupled to first substrate 305a, for example, via copper plating. In other examples, the one or more pillars 310 may be coupled to the first substrate 305a via copper bonding, such as direct copper-to-copper bonding. The one or more pillars 310a-310c may further be coupled to the second substrate 305c. In some examples, the one or more pillars 310 may be soldered to the second substrate 305c. In this way, the one or more pillars 310a-310c form mechanical support between the first and second substrates 305a, 305c while also creating electrical connections between the first and second substrates 305a, 305c (e.g., the respective interconnection layers of the first substrate 305a and second substrate 305c).

In some further embodiments, the one or more pillars 310a-310c may be configured to replace vertical wires for compartment shielding. For example, multiple pillars (including a first pillar 310a and a second pillar 310b) may form a fence or wall to shield the one or more dies 320 from other components, such as the SMT components 315. For example, in some embodiments, the SMT component 315 may cause noise artifacts in the one or more dies 320. Accordingly, the first and second pillars 310a, 310b may be configured to form, for example, a compartment around the SMT component 315, effectively shielding the one or more dies 320 from noise, such as RF noise, created by the SMT component 315.

Figure 4:
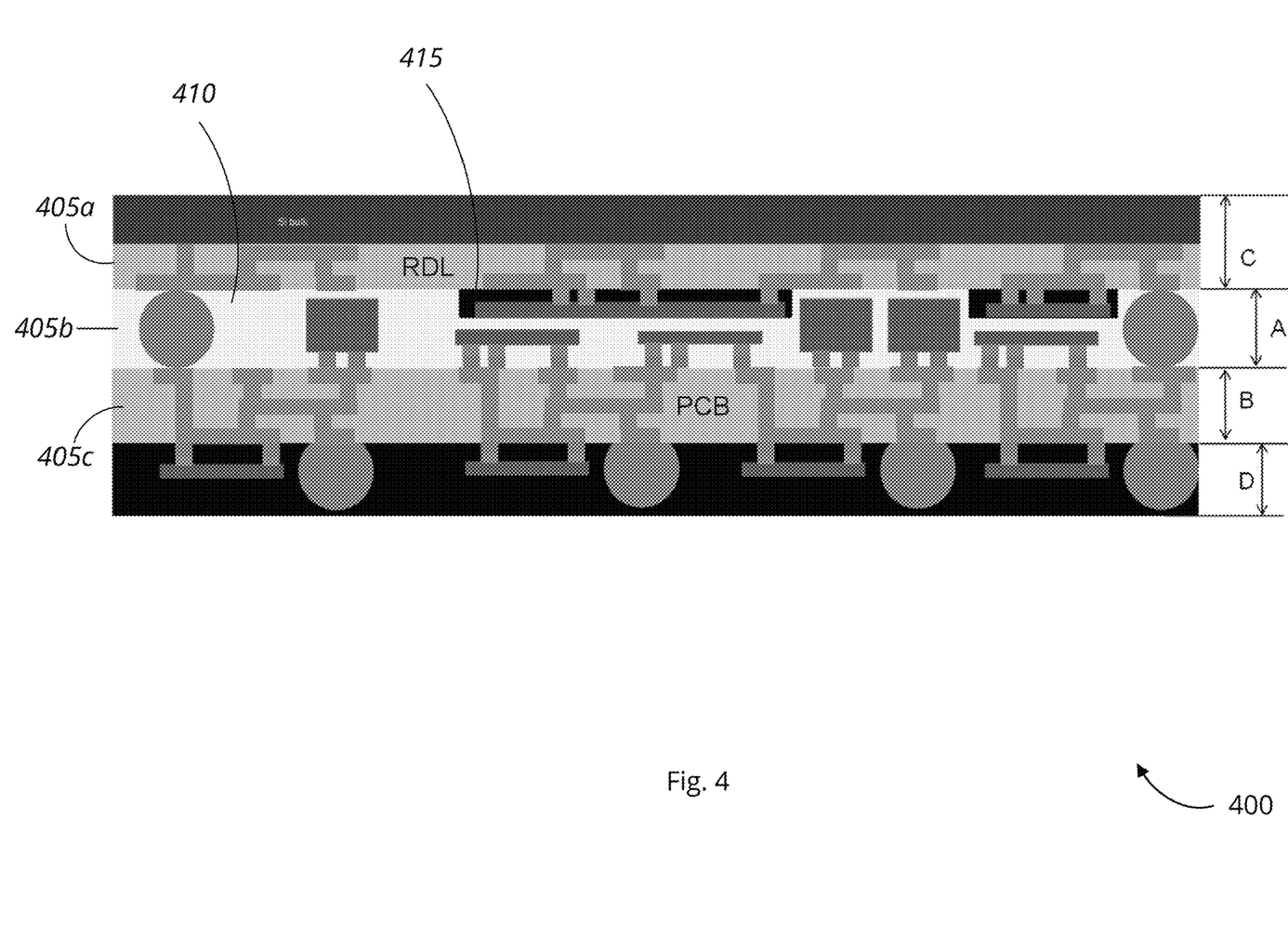
FIG. 4 is a schematic cross-sectional view of a triple-sided module with selectively molded dies, in accordance with various embodiments.

FIG. 4 is a schematic cross-sectional view of a triple-sided semiconductor module 400 with selectively molded dies, in accordance with various embodiments. The semiconductor module 400 includes a first substrate 405a, gap 405b, second substrate 405c, gap molding 410, and die molding 415. It should be noted that the various components of the triple-sided semiconductor module 400 are schematically illustrated in FIG. 4, and that modifications to the various components and other arrangements of triple-sided semiconductor module 400 may be possible and in accordance with the various embodiments.

In various examples, the first substrate 405a may be a RDL, and the second substrate 405c may be a PCB. In this example, the dies mounted to the first substrate 405a may be selectively molded during a manufacturing process. Specifically, the RDL may be formed through a build-up process, and one or more dies attached to the RDL. Molding may be introduced, and a top layer of the dies (and corresponding molding) may be grinded during a grinding process, to a given height and/or thickness. After grinding, the die molding 415 may be selectively removed, for example, using a stop layer, prior to RDL sawing. Thus, die molding 415 may be used to mechanically reinforce the dies attached to the first substrate 405a.

In various examples, after the first substrate 405 is coupled to the second substrate 405c, gap molding 410 may be used to fill the gap 405b between the two substrates 405a, 405c. In some examples, a different EMC may be used for gap molding 410 and die molding 415 to provide different thermo-mechanical properties and/or a different dielectric coefficient ($d_k$).

Figure 5:
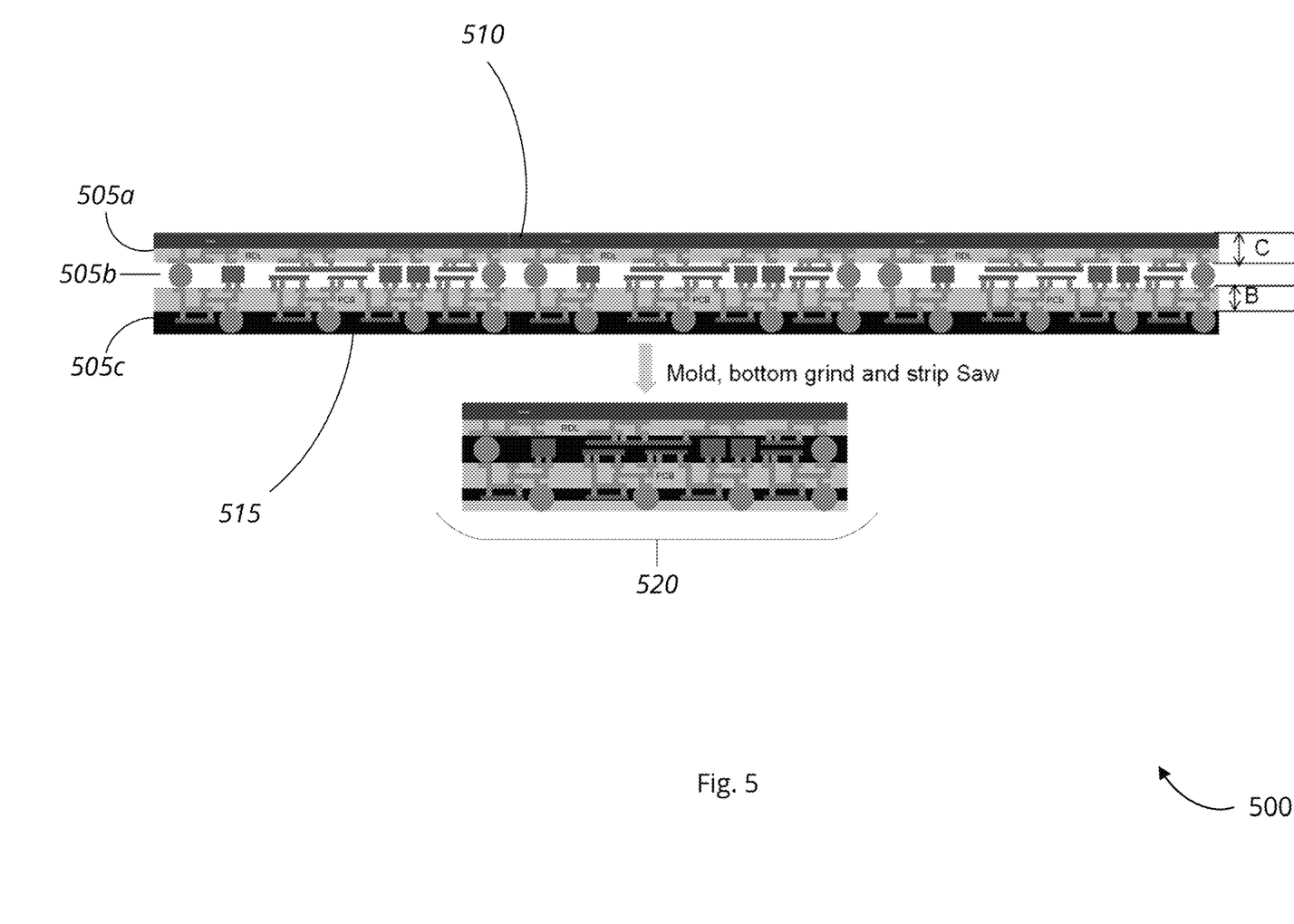
FIG. 5 is a schematic cross-sectional view of a strip assembly process, in accordance with various embodiments.

FIG. 5 is a schematic cross-sectional view of a strip assembly process 500, in accordance with various embodiments. In various examples, the strip assembly process 500 may include mounting of the first substrate 505a to the second substrate 505c in a strip format.

In various examples, a first set of dies (such as the one or more first dies 125a-125b of FIG. 1) may be mounted to the first substrate 505a. In this way, the components may be mounted to the first substrate 505a along the entirety of the first strip. A second set of dies (such as the one or more second dies 130a-130c of FIG. 1) may similarly be mounted to the second substrate 505b, along with one or more SMT components (such as SMT components 120 of FIG. 1) across the entire second strip 515.

In various examples, the first strip 510 may include respective sections of the first substrate 505a corresponding to a plurality of semiconductor modules. Similarly, the second strip 515 may include respective sections of the second substrate 505c corresponding to individual semiconductor modules of the plurality of semiconductor modules. The completed strips 510, 515 may subsequently be assembled together.

Specifically, a first strip 510 of the first substrate 505a may be coupled to a second strip 515 of the second substrate 505c. The first strip 510 may be mounted to the second strip 515, and coupled via one or more solder balls and/or copper posts, as previously described, and approximately parallel in the x-/y-direction. A gap 505b may be formed between the two strips 510, 515. The gap 505b may initially be an air gap between the first strip 510 and second strip 515.

By mounting the first strip 510 to the second strip 515, unit per hour (UPH) assembly of semiconductor modules may be increased. The mounted strips 510, 515 may be molded, grinded, and sawn to form individual triple-sided semiconductor modules. Molding includes introducing EMC into the gap 505b, and further to the bottom layer of the second substrate 505c (e.g., to the bottom layer of a PCB). In some examples, different EMCs may be used to fill gap 505b and to cover components mounted to the bottom layer of the second substrate 505c. As previously described, molding may be used to provide physical reinforcement and mechanical strength, exhibit different thermal characteristics, such as coefficient of thermal expansion (CTE), and may further provide differing $d_k$, which may improve electrical performance.

The bottom molding may then be grinded to an appropriate height, for example, based on the height of bottom surface mounted solder balls, dies, or other components, to ensure such components are covered and/or protected, and interconnections, such as solder balls, are appropriately exposed. The combined strips 510, 515 may then be sawn into individual semiconductor modules.

Figure 6:
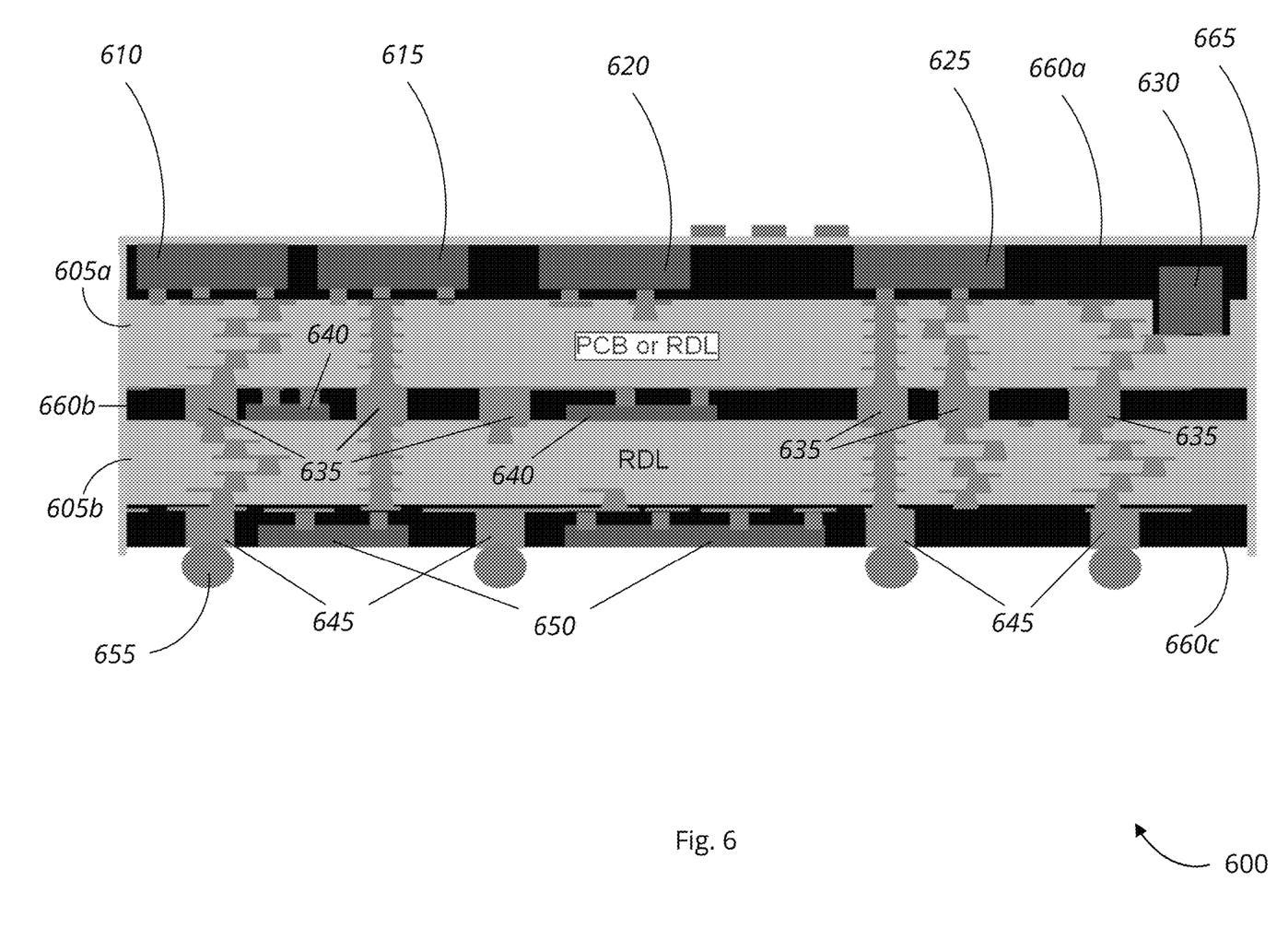
FIG. 6 is a schematic cross-sectional view of a triple-sided module with redistribution layer (RDL) stacking, in accordance with various embodiments.

FIG. 6 is a schematic cross-sectional view of a triple-sided semiconductor module 600 with redistribution layer (RDL) stacking, in accordance with various embodiments. The triple-sided semiconductor module 600 includes a first substrate 605a, second substrate 605b, first set of dies 610-625, SMT component 630, a first set of conductive interconnects 635, second set of dies 640, second set of conductive interconnects 645, third set of dies 650, one or more solder joints 655, first mold layer 660a, second mold layer 660b, third mold layer 660c, and shielding 665. It should be noted that the various components of the triple-sided semiconductor module 600 are schematically illustrated in FIG. 6, and that modifications to the various components and other arrangements of triple-sided semiconductor module 600 may be possible and in accordance with the various embodiments.

In the arrangement depicted, the second substrate 605b is a RDL, on top of which the first substrate 605a may be stacked. Alternatively, the second substrate 605b may be formed (e.g., grown or otherwise fabricated) on a bottom layer of the first substrate 605a (e.g., on second mold layer 660b that has been ground to the appropriate thickness). The first substrate 605a may include a PCB or additional RDL. In contrast with the earlier described embodiments, the first substrate 605a and second substrate 605b may provide three surfaces for die placement. However, in contrast with the previously described embodiments, the first substrate 605a provides two mounting surfaces for die placement, a first surface on a first side (e.g., a top layer or top side) facing away from the second substrate 605b, and a second surface on a second side (e.g., a bottom layer or bottom side) facing the second substrate 605b. The second substrate 605b provides one surface for die placement. A first side (e.g., bottom layer or bottom side) of the second substrate 605b facing away from the first substrate 605a, may be a third surface for die placement.

In some examples, the SMT component 640 may be surface mounted to an internal layer of the first substrate 605a. In some examples, the first substrate 605a may be a PCB. In other examples, the first substrate 605a is a RDL double side mold (DSM).

In the example depicted, the first set of dies 610-625 may be mounted (e.g., surface mounted) to the first side of the first substrate 605a. The first set of dies 610-625 may include, without limitation, a surface acoustic wave (SAW) filter, film bulk acoustic resonator (FBAR), integrated passive device (IPD), power amplifier (PA), or other types of semiconductor dies. As previously described with respect to other embodiments, the first set of dies 610-625 may be coupled to the first substrate 605a, for example, via surface mounting techniques. In some examples, the various components of the triple-sided semiconductor module 600 may be thermally and electromagnetic interference (EMI)-connected to die on the top of the first substrate 605a, including, but not limited to filter die (e.g., FBAR), semiconductor die, PA die, and IPDs, for example, via shielding 665 and/or internal routing layers.

In further examples, an SMT component 630 may further be mounted to the first substrate 605a. In some examples, the SMT component 630 may be mounted in a cavity having a depth of one or more layers, going into the first substrate 605a from first side (e.g., top layer) of the first substrate 605a. In some examples, cavity depth may be in the range of 25-60 µm.

In further examples, the second set of dies 640 may be mounted on the second side of the first substrate 605a (e.g., the bottom layer). In some examples, the second set of die 640 may include, without limitation, filter die, IPDs, and other semiconductor die, coupled, through one or more distribution layers of the first substrate 605a and/or second substrate 605b, to one or more other dies (such as first set of dies 610-625 or third set of dies 650) or passive components (such as SMT component 630). In further examples, a third set of die 650 may to the first side (e.g., bottom layer) of the second substrate 605b. In some examples, the third set of die 650 may include one or more semiconductor dies as described above.

In various examples, a first set of conductive interconnects 635 may couple the first substrate 605a to the second substrate 605b. In some examples, the first set of conductive interconnects 635 may be coupled to a bottom layer (e.g., second side) of the first substrate 605a, and a top layer (e.g., a second side) of the second substrate 605b facing the first substrate 605a. In some examples, the first set of conductive interconnects 635 may be coupled to at least one of the first or second substrates 605a, 605b via copper plating. In further examples, the first set of conductive interconnects 635 may be coupled to at least one of the first or second substrates 605a, 605b via copper bonding (e.g., Cu—Cu bonding) and/or electroplating. Similarly, a second set of conductive interconnects 645 may also be coupled to the first side of the second substrate 605b. In some further examples, one or more solder joints 655 may further be coupled to a respective conductive interconnect of the second set of conductive interconnects 645. The one or more solder joints 655 may include, without limitation, solder balls with and/or without high liquidus metal cores.

In various examples, shielding 665 may further cover at least a top layer of the first substrate 605a, and outside-facing sides of the triple-sided semiconductor module 600. Accordingly, in various embodiments, the triple-sided semiconductor module 600 may be fully shielded (via shielding 665) from electromagnetic interference EMI and/or further thermally shielded via shielding 665.

In further examples, in contrast to the previously described embodiments of FIGS. 1-5, the triple-sided semiconductor module 600 may include three mold layers: a first mold layer 660a, a second mold layer 660b, and third mold layer 660c. A first mold layer 660a may be provided on the top layer of the first substrate 605a, further surrounding the first set of dies 610-625. A second mold layer 660b may be disposed between the first substrate 605a and second substrate 605b. A third mold layer 660c may be disposed below a bottom layer (e.g., first side) of the second substrate 605b. In some examples, the conductive interconnects of the first set of conductive interconnects 635 (e.g., copper posts), and correspondingly the second mold layer 660b itself, may have a thickness of approximately 85 µm. In some examples, the bottom mold layer 660c may have a thickness of approximately 70 µm.

Figure 7:
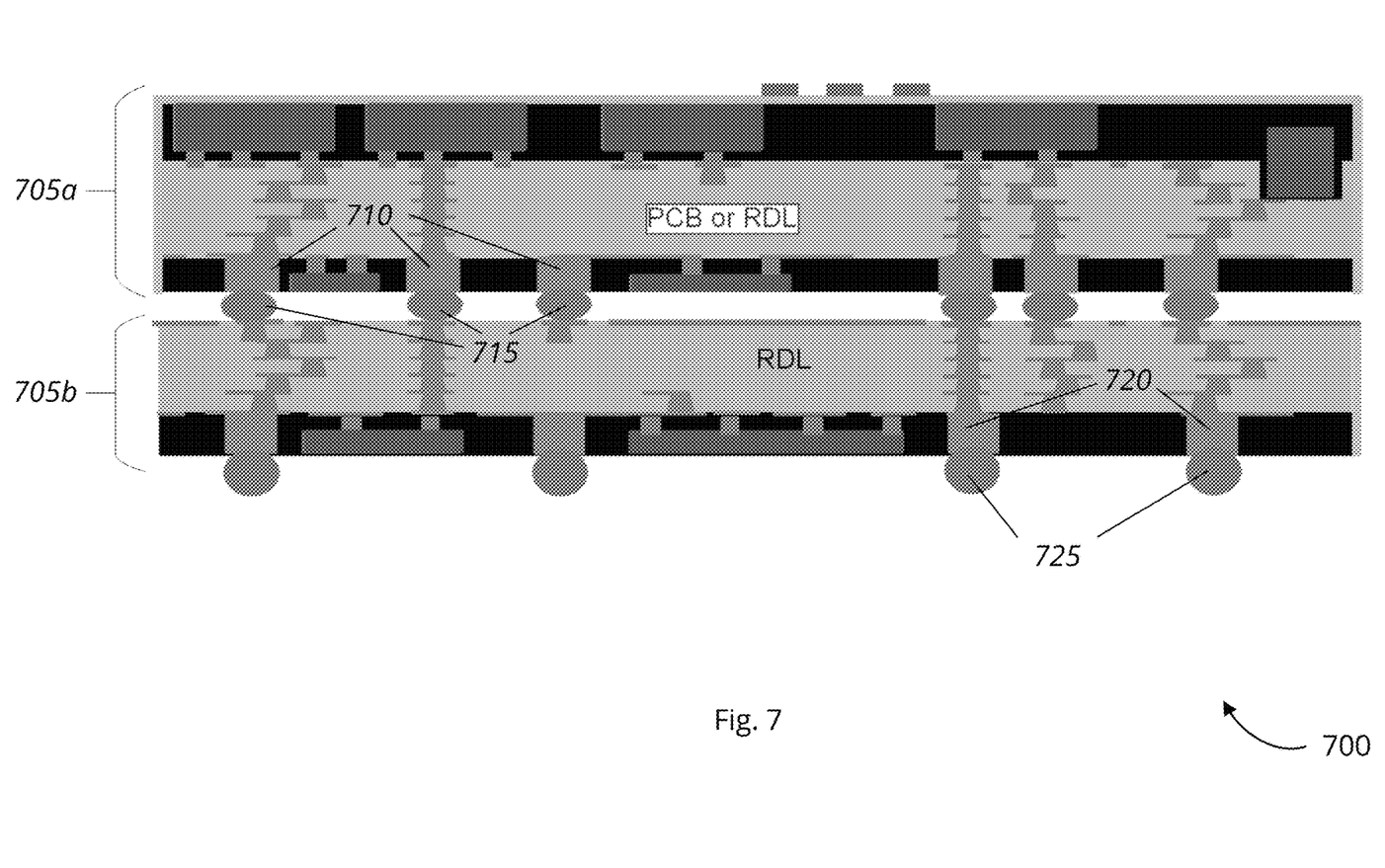
FIG. 7 is a schematic cross-sectional view of a triple-sided module with a ball grid array (BGA) stacked on a RDL, in accordance with various embodiments.

FIG. 7 is a schematic cross-sectional view of a triple-sided semiconductor module 700 with a DSM-BGA stacked on a RDL, in accordance with various embodiments. The triple-sided semiconductor module 700 includes a first substrate 705a sub-module and second substrate 705b sub-module. FIG. 6 depicted embodiments in which the first substrate 605a and second substrate 605b are coupled via conductive interconnects and a mold layer. In contrast with the embodiments of FIG. 6, in various embodiments, the first substrate 705a may be coupled to the second substrate 705b via one or more solder balls, such as a BGA. Specifically, the first substrate 705a sub-module may be a DSM module, having molding on the top layer and bottom layer of the first substrate 705a. The first substrate 705a sub-module may further include a BGA formed on the bottom of the molding of the bottom layer of the first substrate 705a. Specifically, in some embodiments, one or more solder joints 715 may be coupled to respective conductive interconnects 710 (e.g., copper posts, or other interconnect structures formed of other electrically conductive materials) attached to the bottom layer of the first substrate 705a. In some examples, the one or more solder joints 715 may be the solder balls of a BGA. The BGA may be configured to couple to corresponding interconnections, such as copper pads and/or routing layers of the second substrate 705b submodule. In various examples, the second substrate 705b is a RDL, whereas the first substrate may be either a PCB or RDL. Similar to the first substrate 705a, the second substrate 705b may, in some examples, include molding on a bottom layer around one or more respective conductive interconnects 720, which are similarly coupled to one or more solder joints 725. Accordingly, the one or more solder joints 715, 725 may include, without limitation, solder balls with and/or without high liquidus metal cores.

Figure 8:
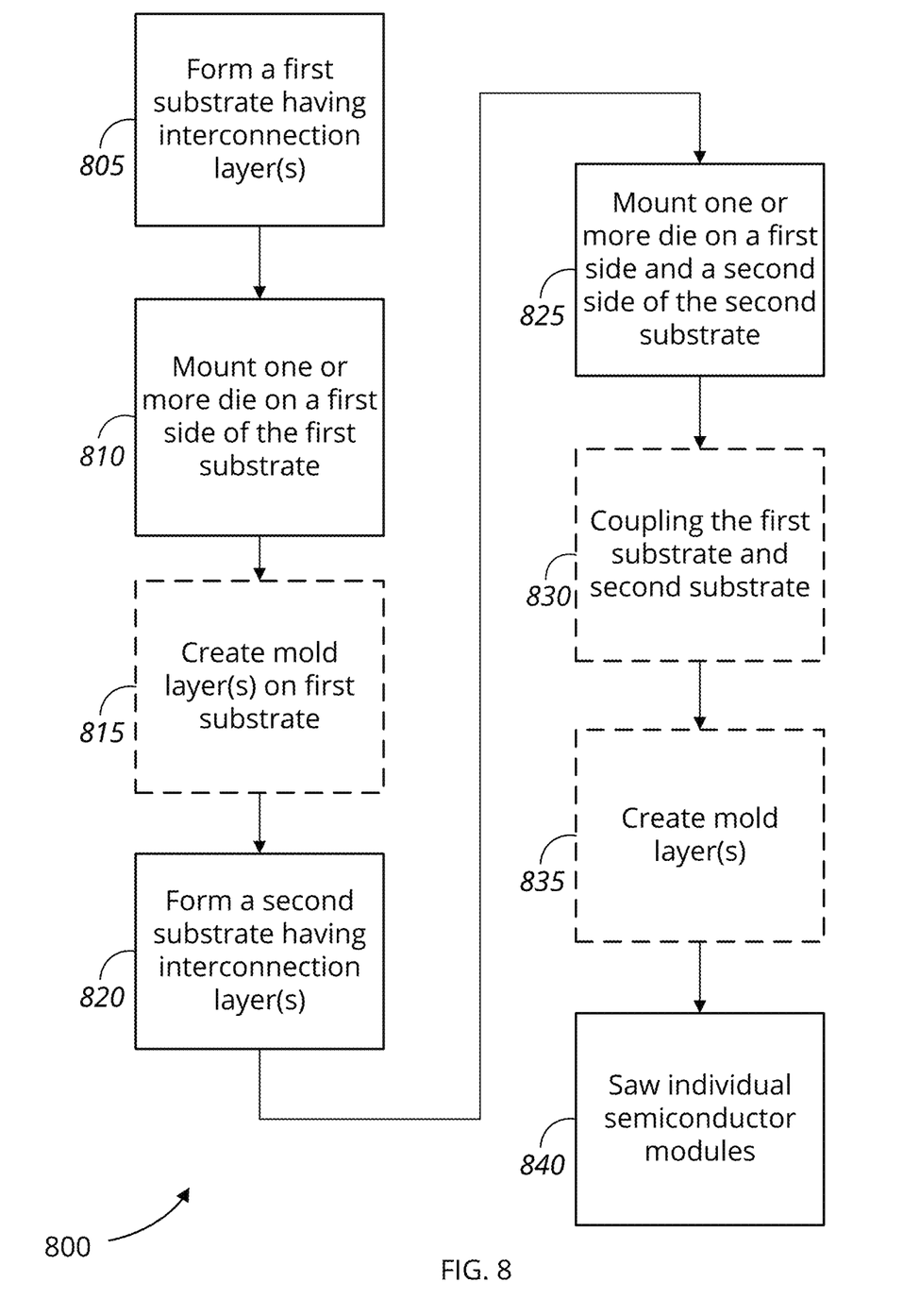
FIG. 8 is a flow diagram of a method of manufacturing a triple-sided module, in accordance with various embodiments.

FIG. 8 is a flow diagram of a method 800 of manufacturing a triple-sided semiconductor module, in accordance with various embodiments. The method 800 may begin, at block 805, by forming a first substrate having one or more interconnection layers. In various embodiments, the first substrate may be one of a RDL or a PCB having one or more internal interconnection layers. Forming the first substrate may include, without limitation, various additive and/or subtractive manufacturing processes, as known to those skilled in the art. In further examples, manufacturing techniques that are being developed and/or yet to be developed may be utilized to form the first substrate layer. Thus, it is to be understood that the method 800 is not limited to any particular method of manufacturing a particular substrate.

The method 800 continues, at block 810, by mounting one or more dies on a first side of the first substrate. For example, the first mounting of the one or more die on the first side of the first substrate may include mounting via one or more surface mounting techniques. For example, mounting of the one or more dies may include, without limitation, soldering, plating, epoxying, die bonding, and/or copper-bonding techniques. In further examples, other components may further be attached to the first side of the first substrate. For example, other components may include, without limitation, passive elements, conductive interconnects (e.g., copper posts), solder joints (e.g., solder balls), or other components. In some examples, conductive interconnects/copper posts may be coupled to the first substrate via copper-bonding. In various examples, copper-bonding may include, without limitation, hybrid copper-bonding (HCB) and/or direct copper-bonding (DCB).

In yet further examples, mounting of the one or more dies may further include selective molding of one or more of the dies. For example, an EMC may be used to create a mold layer covering the one or more dies. The molding may be grinded, and selectively removed from the top layer (e.g., first side) of the first substrate.

In some embodiments, the method 800 may further include, at block 815, creating one or more mold layers on the first substrate. In some examples, mold layers may be formed on one or more sides of the first substrate. Accordingly, in some examples, the first substrate may be a DSM substrate, such as a DSM-RDL or DSM-PCB. In one example, a top mold layer may be formed on a top layer of the first substrate and/or a bottom layer of the first substrate.

The method 800 continues, at block 820, by forming a second substrate having one or more interconnection layers. In various embodiments, the second substrate may similarly be one of a RDL or PCB having one or more interconnection layers. Like the first substrate, formation of the second substrate is not limited to any particular manufacturing technique. In some examples, the second substrate may be formed on the first substrate and/or a mold layer formed on the first substrate. For example, the second substrate may, in some embodiments, be grown on a mold layer that has been formed on the first substrate and ground to a given height.

At block 825, the method 800 may continue by mounting one or more dies on a first side of the second substrate and a second side of the substrate. As previously described, in some examples, the second substrate may provide two mounting surfaces for dies. As previously described, in some examples, further structures may also be mounted to the second substrate, including passive elements, conductive interconnects, solder joints, and the like. Components may be mounted to the second substrate using various mounting techniques, similar to the first substrate. In some examples, the second substrate may include one of a PCB or RDL.

The method 800 continues, at block 830, by coupling the first substrate and second substrate together. As previously described, in some embodiments, one or more solder joints may be used to couple the first and second substrates. In other embodiments, one or more conductive interconnects may be used to couple the first and second substrates. For example, in some embodiments, one or more conductive interconnects may be copper bonded and/or solder bonded to the first and/or second substrates. In some examples, the first substrate may be positioned such that the first side of the first substrate faces the second substrate, and a second side, opposite the first side, of the first substrate may face away from the second substrate. The second substrate may be positioned such that the first side of second substrate faces the first substrate, and a second side, opposite the first side, of the second substrate faces away from the first substrate. In some examples, an alternative arrangement may be utilized such that the first side of the first substrate instead faces away from the second substrate. In yet further embodiments, the second substrate may be formed on the first substrate and/or a mold layer of the first substrate. The second substrate may be formed such that the first and second substrates are coupled conductively (e.g., via one or more conductive interconnects and/or solder joints).

The method 800 continues, at block 835, by creating one or more mold layers. As previously described, in various examples, when the first and second substrates are coupled, a gap may be formed and filled with EMC. In some further examples, mold layers may be formed on one or more sides of the first and/or second substrates. Accordingly, in some examples, the first and/or second substrate may be a DSM-RDL or DSM-PCB. In some examples, a triple-sided module may include three mold layers, a top mold layer, middle mold layer, and bottom mold layer. In one example, a top mold layer may be formed on a top layer of the second substrate, a bottom layer of the second substrate, and on a bottom layer of the first substrate. In some examples, as previously described, molding (e.g., EMC) may be used to provide physical reinforcement and mechanical strength, exhibit different thermal characteristics, such as coefficient of thermal expansion (CTE), and may further provide differing $d_k$, between the different mold layers themselves, and from the EMC which may have been used for selective molding of dies previously described.

The method 800 continues, at block 840, by sawing individual semiconductor modules. In some examples, the first and second substrates may, respectively, be substrate strips. Each strip may be assembled such that they comprise a plurality of respective portions of individual semiconductor modules. Accordingly, when a first strip of the first substrate is coupled to a second strip of the second substrate, a plurality of semiconductor modules may be formed. The coupled first and second strip may, accordingly, be sawed into respective individual semiconductor modules.

The techniques and processes described above with respect to various embodiments may be used to manufacture the triple sided semiconductor modules 100, 200, 300, 400, 500, 600, and 700, and/or components thereof, as described herein.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
a first substrate comprising one or more first interconnection layers, wherein a first die is coupled to a first side of the first substrate;
a second substrate comprising one or more second interconnection layers, wherein a second die is coupled to a first side of the second substrate, and a third die is coupled to a second side of the second substrate;
a first mold layer formed on the first side of the first substrate;
a second mold layer formed between the first and second substrate; and
a third mold layer formed on the second side of the second substrate;
wherein the first substrate and the second substrate are stacked together.

2. The apparatus of claim 1, wherein the first substrate is a first printed circuit board.

3. The apparatus of claim 2, wherein the second substrate is a redistribution layer.

4. The apparatus of claim 2, wherein the second substrate is a second printed circuit board.

5. The apparatus of claim 1, wherein the first substrate is a redistribution layer.

6. The apparatus of claim 1, wherein the first substrate positioned such that the first side of the first substrate faces the second substrate, wherein second substrate is positioned such that the first side of the second substrate faces the first substrate, and wherein the second side of the second substrate is positioned opposite the first side of the second substrate.

7. The apparatus of claim 1, further comprising one or more solder joints mounted to the first substrate, wherein the one or more solder joints are configured to couple the first substrate to the second substrate.

8. The apparatus of claim 1, further comprising one or more conductive interconnects mounted to the first substrate, wherein the one or more conductive interconnects are configured to couple the first substrate to the second substrate.

9. A semiconductor device comprising:
a first semiconductor module further including:
a first substrate comprising one or more first interconnection layers;
a first die coupled to a first side of the first substrate; and
a second semiconductor module coupled to the first semiconductor module, the second semiconductor module comprising:
a second substrate comprising one or more second interconnection layers;
a second die coupled to a first side of the second substrate; and
a third die coupled to a second side of the second substrate;
a first mold layer formed on the first side of the first substrate;
a second mold layer formed between the first and second substrate; and
a third mold layer formed on the second side of the second substrate;
wherein the first semiconductor module and the second semiconductor module are stacked together.

10. The apparatus of claim 9, wherein the first substrate is a first printed circuit board.

11. The apparatus of claim 10, wherein the second substrate is a redistribution layer.

12. The apparatus of claim 10, wherein the second substrate is a second printed circuit board.

13. The apparatus of claim 9, wherein the first substrate is a redistribution layer.

14. The apparatus of claim 9, wherein the first substrate positioned such that the first side of the first substrate faces the second substrate, wherein second substrate is positioned such that the first side of the second substrate faces the first substrate, and wherein the second side of the second substrate is positioned opposite the first side of the second substrate.

15. The apparatus of claim 9, further comprising at least one of one or more solder joints or one or more conductive interconnects mounted to the first substrate, wherein the at least one of the one or more solder joints and one or more conductive interconnects are configured to couple the first substrate to the second substrate.

* * * * *